(12) United States Patent
Ankireddi et al.

(10) Patent No.: US 9,355,932 B2
(45) Date of Patent: *May 31, 2016

(54) HEAT DISSIPATION STRUCTURE FOR AN INTEGRATED CIRCUIT (IC) CHIP

(71) Applicant: Oracle International Corporation, Redwood City, CA (US)

(72) Inventors: Seshasayee S. Ankireddi, San Jose, CA (US); David W. Copeland, Mountain View, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/828,411

(22) Filed: Aug. 17, 2015

(65) Prior Publication Data

US 2015/0357260 A1    Dec. 10, 2015

Related U.S. Application Data

(63) Continuation of application No. 13/314,995, filed on Dec. 8, 2011, now Pat. No. 9,184,108.

(51) Int. Cl.
*H05K 7/20* (2006.01)
*H01L 23/367* (2006.01)
(Continued)

(52) U.S. Cl.
CPC .......... *H01L 23/3675* (2013.01); *H01L 23/367* (2013.01); *H01L 23/3672* (2013.01); *H01L 23/44* (2013.01); *H01L 23/473* (2013.01); *H01L 23/498* (2013.01); *H05K 7/20927* (2013.01); *H01L 2224/16225* (2013.01); *H01L 2224/73253* (2013.01); *H05K 1/0272* (2013.01)

(58) Field of Classification Search
CPC .............. H01L 23/367; H01L 23/3672; H01L 23/3675; H01L 23/44; H01L 23/473; H01L 23/498; H01L 31/024; H01L 2224/16225; H01L 2224/73253; H05K 1/272; H05K 7/20927; H05K 7/20936; H05K 7/20981; H05K 7/2099; H05K 1/0272; G06F 1/203
USPC ............... 361/679.47, 679.54, 697, 703, 709, 361/710, 718, 719; 174/252
See application file for complete search history.

(56) References Cited

U.S. PATENT DOCUMENTS 4,620,216 A * 10/1986 Horvath ................. H01L 23/367
257/713
5,894,882 A * 4/1999 Kikuchi .................. F28F 3/027
165/185

(Continued)

*Primary Examiner* — Anatoly Vortman
*Assistant Examiner* — Jacob Crum
(74) *Attorney, Agent, or Firm* — Park, Vaughan, Fleming & Dowler LLP

(57) ABSTRACT

An apparatus for cooling an integrated circuit (IC) die is described. The apparatus includes an adhesion layer coated on a surface of the IC die, wherein the adhesion layer has high thermal conductivity. The apparatus also includes a heat dissipation structure affixed onto the adhesion layer. This heat dissipation structure further includes a set of discrete heat dissipation elements which are substantially mechanically isolated from each other. This set of discrete heat dissipation elements provides an extended heat dissipation surface for the IC die. Moreover, each of the set of discrete heat dissipation elements has high compliance, which allows the adhesion layer to be sufficiently thin, thereby reducing a thermal conductivity of the adhesion layer.

20 Claims, 6 Drawing Sheets

(51) Int. Cl.
    *H01L 23/498*    (2006.01)
    *H01L 23/473*    (2006.01)
    *H01L 23/44*     (2006.01)
    *H05K 1/02*      (2006.01)

(56) References Cited

U.S. PATENT DOCUMENTS

| | | | | |
|---|---|---|---|---|
| 6,161,610 A * | 12/2000 | Azar | ............... | F28F 3/02 165/185 |
| 6,234,239 B1 * | 5/2001 | Azar | ............... | F28F 3/02 165/185 |
| 7,442,882 B2 * | 10/2008 | Gilliland | ............... | H01L 23/467 165/172 |
| 7,492,599 B1 * | 2/2009 | Yu | ............... | F21K 9/00 165/185 |
| 7,613,004 B2 * | 11/2009 | Sasaki | ............... | F28F 3/02 165/185 |
| 7,713,789 B2 * | 5/2010 | Brunschwiler | ..... | H01L 21/4871 257/706 |
| 2009/0316360 A1 * | 12/2009 | Campbell | ............. | H01L 23/473 361/699 |
| 2010/0002392 A1 * | 1/2010 | Liu | ............... | H01L 21/4882 361/699 |
| 2012/0132400 A1 * | 5/2012 | Hosokawa | ......... | H01L 23/3672 165/104.19 |

* cited by examiner

HEAT DISSIPATION STRUCTURE FOR AN INTEGRATED CIRCUIT (IC) CHIP

RELATED CASE

This application is a continuation of, and hereby claims priority under 35 U.S.C. §120 to, pending U.S. patent application Ser. No. 13/314,995, entitled "Design of a Heat Dissipation Structure for an Integrated Circuit (IC) Chip," by inventors Seshasayee Ankireddi and David W. Copeland, which was filed on 8 Dec. 2011, and which is hereby incorporated by reference.

BACKGROUND

1. Field

The disclosed embodiments are related to integrated circuit (IC) chip cooling mechanisms. More specifically, the disclosed embodiments are related to designs of a heat dissipation structure for an IC chip.

2. Related Art

The dramatic increase in the power and speed of IC chips in computer systems, such as servers, has given rise to increasing challenges in removing the heat generated by these IC chips during system operation. Some chip cooling techniques place an IC chip inside a lidded package which interfaces with an air-cooled heat sink for heat dissipation. Other chip cooling techniques provide further improvement on the heat dissipation path (also referred to as the "thermal path") by reducing thermal resistance between the chip surface and the heat sink. For example, some techniques replace the air-cooled heat sink with a liquid-cooled cold-plate. Other techniques attempt to reduce thermal resistance by eliminating any material between the chip surface and the heat sink.

Separately, direct liquid cooling techniques which can bring coolant in direct contact with the silicon surface have been proposed. To avoid electric shorting problems associated with these techniques, a dielectric fluid can be used as the coolant. However, the limited chip surface area can limit the amount of heat that can be effectively removed by the coolant, and can also be subject to the risk of overheating and boiling the coolant. Such risk subsequently limits the effective operating power of the IC chip.

Hence, what is needed is an IC chip cooling mechanism without the above-described problems.

SUMMARY

The described embodiments provide an apparatus for cooling an integrated circuit (IC) die. The apparatus includes an adhesion layer coated on a surface of the IC die, wherein the adhesion layer, preferably solder, has high thermal conductivity. The apparatus also includes a heat dissipation structure affixed onto the adhesion layer. This heat dissipation structure further includes a set of discrete heat dissipation elements which are substantially mechanically isolated from each other. This set of discrete heat dissipation elements provides an extended heat dissipation surface for the IC die. Note that each of the set of discrete heat dissipation elements has high compliance, which allows the adhesion layer to be sufficiently thin, thereby reducing a thermal conductivity of the adhesion layer.

In some embodiments, the set of discrete heat dissipation elements is a two-dimensional (2D) array of heat dissipation plates/fins.

In some embodiments, plates in the array of heat dissipation plates are substantially identical to each other.

In some embodiments, plates in the array of heat dissipation plates are oriented substantially in the same direction.

In some embodiments, a plate in the array of heat dissipation plates is oriented such that the largest face of the plate is perpendicular to the surface of the IC die.

In some embodiments, a thickness of the plate which is along a direction perpendicular to the largest face of the plate is significantly smaller than a length and a height of the plate that are associated with the largest face.

In some embodiments, the width of the plate is a fraction of 1 millimeter.

In some embodiments, the length of the plate which is along a direction parallel to the surface of the IC die is between 1 millimeter and 10 millimeters.

In some embodiments, the height of the plate which is along a direction perpendicular to the surface of the IC die is between 0 and 10 millimeters.

In some embodiments, a pitch of a row of heat dissipation plates in the width-direction is between 0.1 millimeters and 1 millimeter.

In some embodiments, a row of heat dissipation plates in the width-direction are interconnected by a first set of connecting beams at upper corners of the heat dissipation plates away from the surface of the IC die.

In some embodiments, a column of heat dissipation plates in the length-direction are interconnected by a second set of connecting beams at upper corners of the heat dissipation plates away from the surface of the IC die.

In some embodiments, a channel between two adjacent heat dissipation plates in the width-direction provides a path for a coolant to flow through while making direct contact with the associated faces of the heat dissipation plates.

In some embodiments, the array of heat dissipation plates is arranged such that more heat dissipation plates are placed in the vicinity of a thermal hotspot on the surface of the IC die.

In some embodiments, the adhesion layer has a thermal conductivity of at least 10 watts/meter/° C.

In some embodiments, the thickness of the adhesion layer is between 10 microns and 50 microns.

In some embodiments, the adhesion layer can include an epoxy layer or a solder layer.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The described embodiments provide an extended heat transfer surface for IC chip heat removal, such as by using an array of fin-shaped heat dissipation plates. In some embodiments, the extended heat transfer surface is prepared separately and then attached onto the chip surface using a compliant adhesion layer made of an epoxy or a solder. Note that this process does not require etching channels into a chip substrate. When the extended heat transfer surface is used in combination with a direct liquid cooling technique, wherein coolant is brought in contact with the silicon device, the extended heat transfer surface facilitates achieving much higher device power and/or lower operating temperature.

Unlike some existing techniques which attach a rigid monolithic cooling structure onto the chip surface, some embodiments assemble a discrete cooling structure, such as a set of cooling fins, onto the chip surface. In some embodiments, a high thermal conductivity epoxy layer or solder layer coated over the chip surface provides a compliant interface between the cooling fins (or other discrete cooling structure) and the silicon device surface. Note that when a monolithic heat sink is attached to a chip surface, a minimum solder thickness, typically in the hundreds of microns, is often needed to accommodate the thermal mismatch between the rigid heat sink structure and the silicon chip, thereby significantly increasing thermal resistance in the heat dissipation path. In comparison, the discrete heat dissipation structure can have much higher compliance than a monolithic heat dissipation structure, which enables a much thinner solder layer to be used as the interface/adhesion layer. Moreover, the discrete heat dissipation structure can include a large number of cooling fins wherein the fin pitch and fin height can be varied to vary the overall heat transfer surface of the discrete heat dissipation structure. In some embodiments, the fin pitch and fin height can be varied locally based on the distribution of the thermal hotspots over the chip surface.

Figure 1:
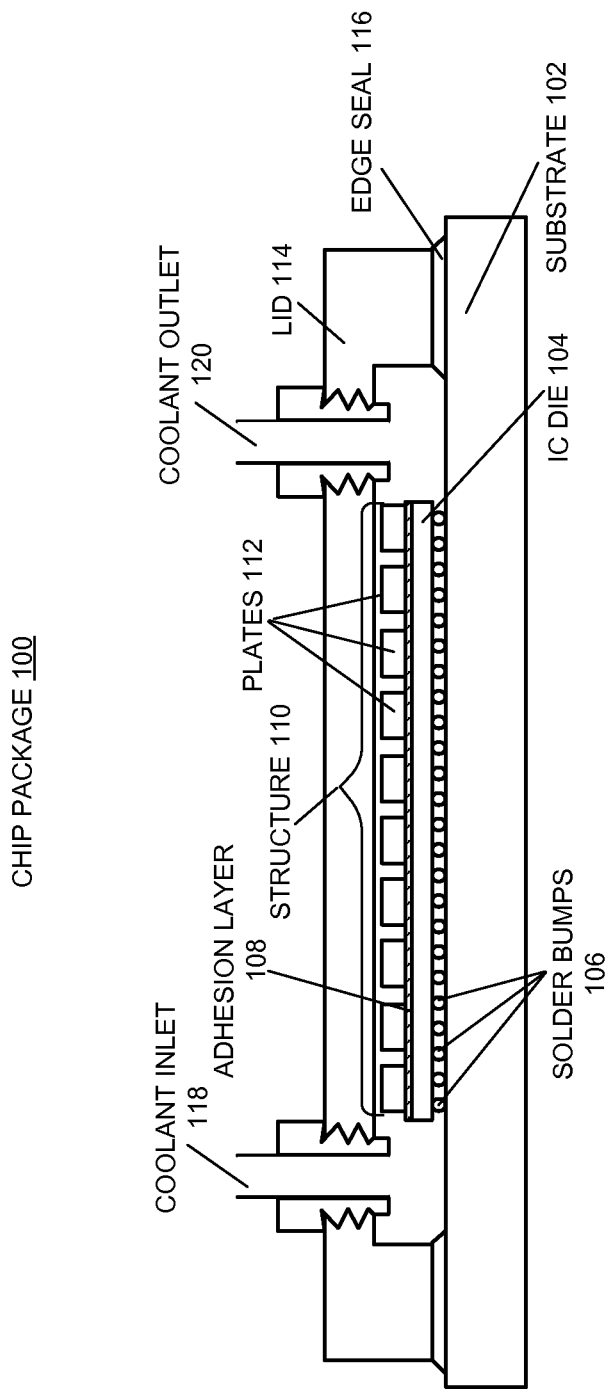
FIG. 1 illustrates a side view of a chip package in accordance with the described embodiments.

FIG. 1 illustrates a side view of a chip package 100 in accordance with the described embodiments. As illustrated in FIG. 1, chip package 100 includes a substrate 102 which serves as the base of chip package 100. IC die 104 is affixed on top of substrate 102 through an interface comprising a group of solder bumps 106. These solder bumps create a space between substrate 102 and IC die 104 and provide electrical and mechanical contact between the two parts. While IC die 104 is typically a semiconductor die, in other embodiments a different material than a semiconductor may be used as the substrate material for IC die 104. However, in embodiments in which silicon is used, IC die 104 may be fabricated using standard silicon processing. In some embodiments, IC die 104 provides silicon area that supports logic and/or memory functionality.

On top of IC die 104 is a thin adhesion layer 108 which is used to attach a heat sink structure onto IC die 104. In some embodiments, adhesion layer 108 can be made of an epoxy material or a solder. In other embodiments, adhesion layer 108 can also be made of other metallic or ceramic materials. When choosing a proper material for adhesion layer 108, both high thermal conductivity and high compliance are preferred. Note that a solder typically has higher thermal conductivity than an epoxy. However, when solder, such as a low melting temperature solder, is used as adhesion layer 108, it may require a much thicker solder layer than an epoxy layer to achieve the same degree of compliance to match the difference in thermal expansions between the silicon chip and a monolithic heat sink structure. Due to its high thermal conductivity, a solder layer can be quite thick without significantly increasing the thermal resistance. A very thick solder layer can also have an undesirably high thermal resistance. Moreover, a solder layer 108 typically requires the surface of IC die 104 to be pre-coated with a wettable metal such as gold.

Chip package 100 also includes a heat sink structure 110 which comprises an array of discrete heat dissipation fins 112 attached to adhesion layer 108. These heat dissipation plates can be made of a highly conductive material, such as copper. In one embodiment, each of heat dissipation plates 112 is a plate-shaped foil which has a dimension perpendicular to the page (referred to as the "span" direction) that is significantly smaller than the other two dimensions (i.e., length and height directions) visible in FIG. 1. Hence, a large number of thin plates can be fitted in the span-direction by using a finer pitch in the span-direction. In one embodiment, the pitch between plates is a fraction of a millimeter. The array of heat dissipation plates collectively forms an extended heat dissipation surface, wherein the total area of the extended heat dissipation surface can be varied by controlling the plate pitch, the plate height, and the total number of plates in heat sink structure 110.

These thin foils may be mechanically isolated from each other. In this case, each plate may be attached to the adhesion layer 108 individually. In some embodiments, the array of heat dissipation plates 112 is loosely connected in one direction (either length-wise or span-wise) to form interlinked rows or columns of plates. In this case, each interlinked row or column of plates may be attached to adhesion layer 108 individually. In some embodiments, the links between plates are closer to the top end of the plates 112 and further away from the chip surface. In some embodiments, the array of heat dissipation plates 112 is connected in both directions (length-wise and span-wise) to form a monolithic structure.

As mentioned above, if solder is used as adhesion layer 108 between the silicon chip and a monolithic heat sink structure, a thick solder layer of up to a few hundred microns is often needed to accommodate stress caused by thermal mismatch between the monolithic heat sink structure and the silicon chip. Compared with a monolithic heat sink structure, heat dissipation structure 110 has significantly higher compliance. This enables a much thinner solder layer to be used as adhesion layer 108 to match the significantly reduced thermal expansion difference between the silicon-based IC die 104 and heat dissipation structure 110. As a result, the thermal resistance in the thermal path of chip package 100 is also reduced.

Referring back to chip package 100, note that the assembly of IC die 104, solder bumps 106, adhesion layer 108, and heat dissipation plates 112 is covered by a package lid 114 which can both protect the chip assembly and spread heat dissipated by heat dissipation structure 110. In the embodiment shown, package lid 114 is affixed onto substrate 102 by using edge seal 116.

In the embodiment of FIG. 1, package lid 114 has openings to allow a coolant to flow into and out of the space underneath package lid 114. More specifically, package lid 114 may include a coolant inlet 118 and a coolant outlet 120, both of which are configured as vertical nozzles going through package lid 114. In some embodiments, there can be an array of coolant inlets and an array of coolant outlets in package lid 114. Note that when coolant flows over the chip die, the fluid will travel between the gaps created by the array of heat dissipation plates 112. While not shown, a manifold can also be added in chip package 100 for guiding the coolant toward and away from the plates 112.

Note that although the heat dissipation structure 110 is described in the context of chip package 100 as illustrated in FIG. 1, the proposed heat dissipation structure can operate when integrated with other types of chip packages. Hence, the application of the proposed heat dissipation structure is not limited to the specific implementation of chip package 100 as illustrated in FIG. 1.

Figure 2A:
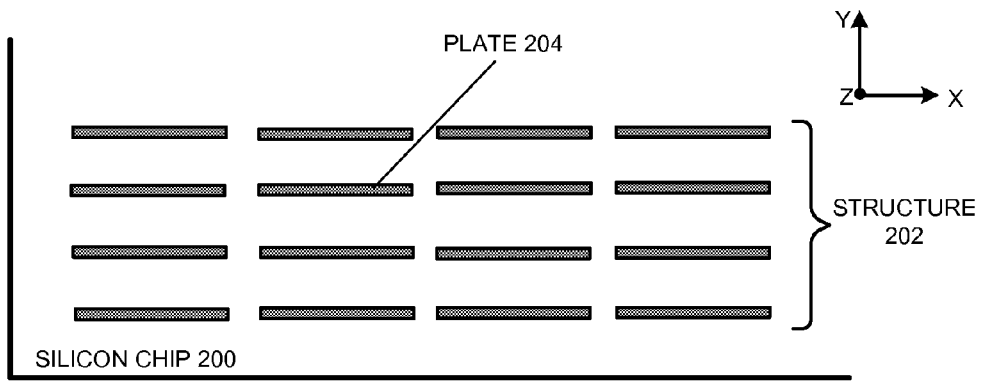
FIG. 2A illustrates the top view of a heat dissipation structure (partially shown) in accordance with the described embodiments.

FIG. 2A illustrates the top view of a heat dissipation structure 202 (partially shown) in accordance with the described embodiments. In the embodiment shown, heat dissipation structure 202 comprises an array of isolated plates arranged in a uniform pattern and attached to a silicon chip 200. More specifically, heat dissipation structure 202 comprises a two-dimensional (2D) array of isolated plates arranged in in-lined rows and columns. Note that each plate in heat dissipation structure 202, such as plate 204, is completely separated from other plates. In some embodiments, each plate in structure 202 has a fin-shaped geometry. For example, plate 204 can have a length (in the x-direction) in a range of 1 millimeter to a few millimeters; a width (in the y-direction, also referred to as the span-direction above) of a fraction of a millimeter; and a height (in the z-direction) between 0 and 10 millimeters. In one embodiment, the length of the plate is greater than its height. For example, plate 204 can be 2 mm in height and 5 mm in length. Typically, both the length and the height of a plate are greater than its width. Note that because each plate in heat dissipation structure 202 is significantly shorter in length than the dimensions of silicon chip 200 (e.g., a typical chip size of 1 inch×1 inch) and has a very narrow width, heat dissipation structure 202 becomes highly compliant at each plate location to enable a thinner adhesive layer to be used between heat dissipation structure 202 and silicon chip 200. Moreover, the fin-shaped geometry of each plate facilitates achieving more uniform thermal distribution over the plate surface.

Figure 2B:
FIG. 2B illustrates the top view of another heat dissipation structure (partially shown) in accordance with the described embodiments.

FIG. 2B illustrates the top view of a heat dissipation structure 212 (partially shown) in accordance with the described embodiments. In the embodiment shown, heat dissipation structure 212, which is attached to a silicon chip 210, comprises an array of isolated fin-shaped plates arranged such that two adjacent rows or columns are offset by an equal amount from each other. Note that the configuration of the array of heat dissipation plates in FIG. 2B is only an example to demonstrate that the plate array in the heat dissipation structure can be arranged in different patterns other than the in-line pattern as shown in FIG. 2A. Moreover, the plate array can also be arranged in a non-uniform pattern. Note that power dissipation over the surface of silicon chip 210 may not be uniformly distributed and hot spots can exist at multiple locations on the surface. Hence, the plate array can be arranged to increase heat removal capacity in the vicinity of these hotspots (if the locations of the hotspots can be determined beforehand). For example, a finer plate pitch can be used around a predetermined hotspot location so that more plates can be assembled to achieve a greater combined heat dissipation surface around the predetermined hotspot location. Furthermore, at a known hotspot location, the plate size can be increased to increase the heat dissipation area, for example, by increasing plate height.

Figure 2C:
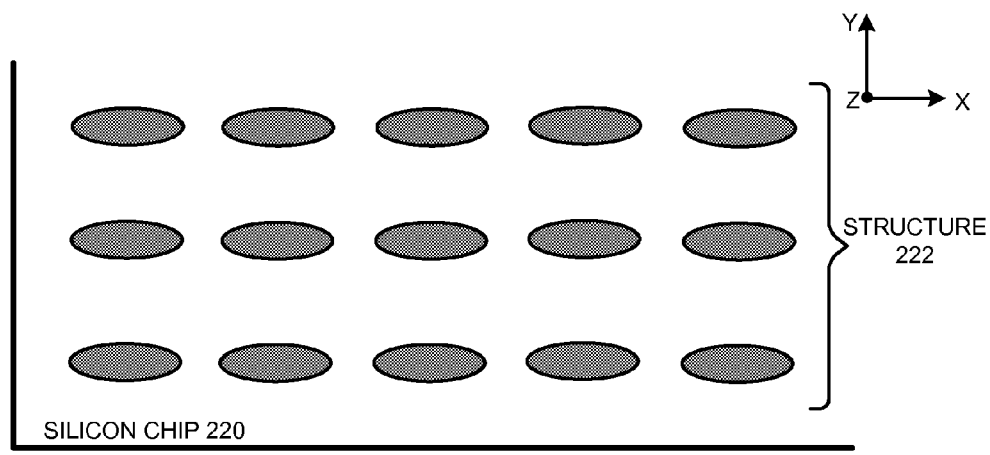
FIG. 2C illustrates the top view of yet another heat dissipation structure (partially shown) in accordance with the described embodiments.

FIG. 2C illustrates the top view of a heat dissipation structure 222 (partially shown) in accordance with the described embodiments. In the embodiment shown, heat dissipation structure 222 comprises an array of elliptical fins arranged in a uniform 2D pattern and attached to a silicon chip 220. As noted above, other embodiments may use a smaller fin pitch (e.g., in the Y-direction) or a larger fin height (in the Z-direction) around a predetermined hotspot location on silicon chip 220, so that more fins may be assembled around the predetermined hotspot location to achieve a greater combined heat dissipation surface. Although FIGS. 2A-2C illustrate heat dissipation structures comprising rectangular and elliptical geometries, a heat dissipation structure can comprise an array of heat dissipation elements made into other geometries, e.g., circles, ovals, or polygons.

Figure 3A:
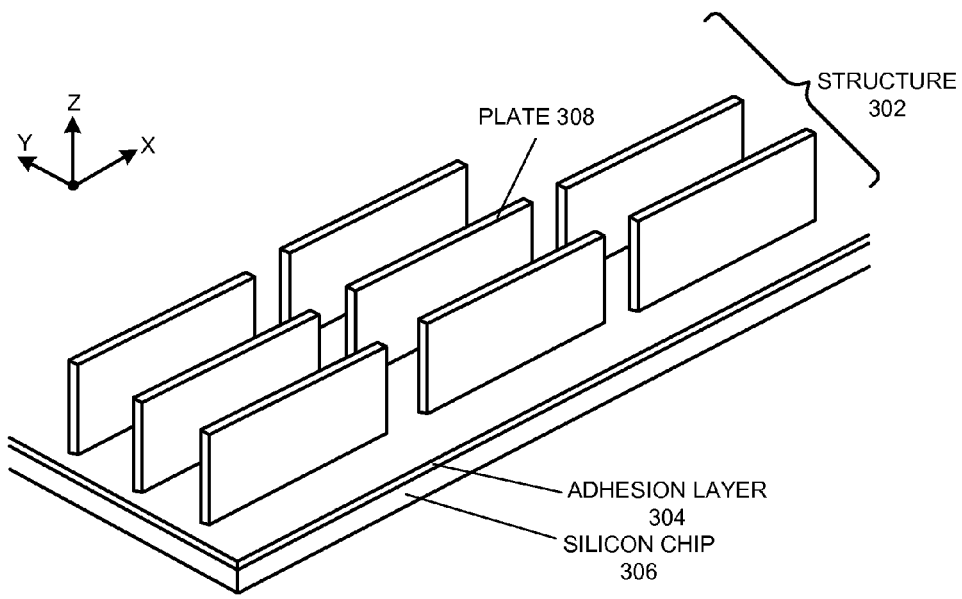
FIG. 3A illustrates a three-dimensional (3D) view of a heat dissipation structure (partially shown) in accordance with the described embodiments.

FIG. 3A illustrates a three-dimensional (3D) view of a heat dissipation structure 302 (partially shown) in accordance with the described embodiments. In the embodiment shown, heat dissipation structure 302 comprises an array of isolated plates similar to the embodiment of FIG. 2A. Furthermore, heat dissipation structure 302 is attached to an adhesion layer 304 which is coated on top of a silicon chip 306. In one embodiment, adhesion layer 304 is an epoxy layer whose thermal conductivity is between 5 watts/meter/° K and 20 watts/meter/° K. In another embodiment, adhesion layer 304 is a solder layer whose thermal conductivity is between 50 watts/meter/° K and 80 watts/meter/° K. In some embodiments, adhesion layer 304 has a thermal conductivity which is at least 10 watts/meter/° K.

In the embodiment shown in FIG. 3A, each fin-shaped heat dissipating plate in heat dissipation structure 302 has a length (in the x-direction) greater than its height (in z-direction), while both length and height are significantly greater than its width (in the y-direction or the span-direction). Moreover, the set of fins are discrete and are not mechanically coupled to one another except through the surface of adhesion layer 304 to which they are all attached. The combined fin-shaped geometry and mechanical isolation of the set of plates in heat dissipation structure 302 makes heat dissipation structure 302 highly compliant. As a result, the minimum required thickness of the adhesion layer 304 can be significantly reduced. In some embodiments, adhesion layer 304 can have a thickness range from 10 μm to 50 μm. In one embodiment, adhesion layer 304 has a thickness around 25 μm. Note that adhesion layer 304 can be made of epoxy or solder, or other adhesive materials with similar thermal conductivity. Note that adhesion layer 304 should have a low melting temperature, lower than the melting temperature(s) of the solder bumps or anything else in the package. A surface-mount package, such as a Ball Grid Array (BGA) would require the melting temperature of the adhesion layer 304 to be higher than that of the solder balls. In one embodiment, each fin-shaped plate in heat dissipation structure 302 is individually attached to adhesion layer 304 during the chip-package assembling process.

Note that each plate, such as plate 308, in heat dissipation structure 302 has the two largest heat dissipation surfaces in the span-direction (y-direction), which is determined by its length and height. The heat dissipation surface area of plate 308 can be further increased by increasing the height of the plate. The overall heat dissipation surface area of heat dissipation structure 302 equals the heat dissipation surface area of each plate multiplied by the total number of plates in the array. Hence, a greater overall surface area can be achieved by increasing the plate density span-wise by decreasing the plate pinch. In the embodiment wherein a coolant is allowed to flow directly over the chip surface, the gaps between plates become channels of coolant flow. Therefore, increasing the height of the plates can also increase the contact area between heat dissipation structure 302 and the coolant flow, thereby further improving the heat removal capability of the cooling mechanism.

Figure 3B:
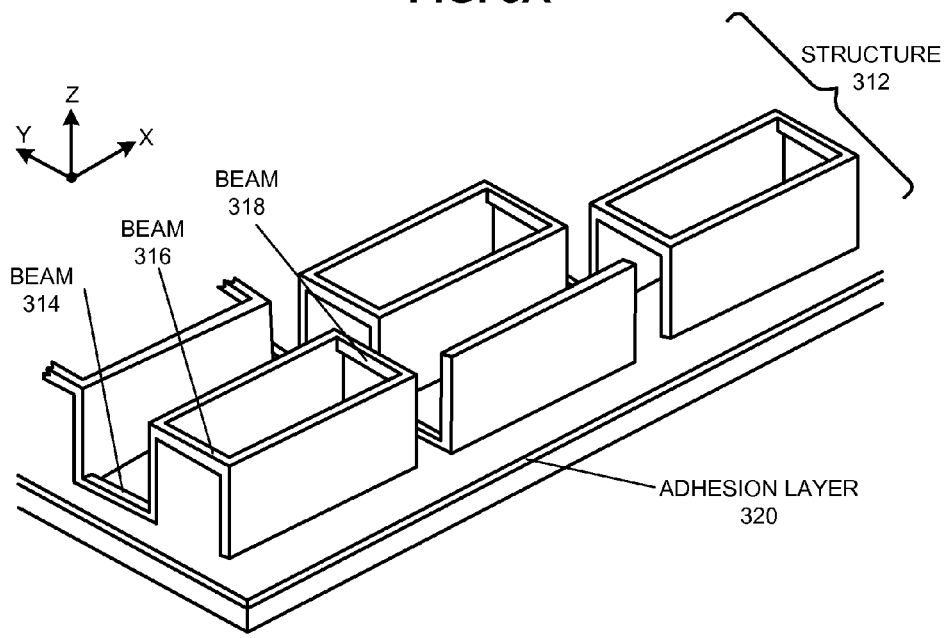
FIG. 3B illustrates a 3D view of another heat dissipation structure (partially shown) in accordance with the described embodiments.

FIG. 3B illustrates a 3D view of a heat dissipation structure 312 (partially shown) in accordance with the described embodiments. Unlike heat dissipation structure 302 which comprises an array of completely isolated plates, heat dissipation structure 312 comprises a set of heat dissipation plates connected span-wise by a set of connecting beams, for example, beams 314-318. Note that beam 314 is connected to the bottom corners of the plates near the chip surface while beams 316 and 318 are connected to the upper corners of the plates away from the chip surface. In one embodiment, these connecting beams have negligible cross-section areas (in the span-direction) compared to the surface area of the heat dissipation plates in the same direction. Consequently, these connecting beams do not significantly change the compliance of the mechanically coupled plates in the span-direction. Also note that in the embodiment shown, the plates in the length-direction are not connected and remain mechanically isolated. In this embodiment, a set of interconnected plates in the span-direction can be attached to adhesion layer 320 together, which reduces chip package assembling time. Although FIG. 3B illustrates some connecting beams located near the chip surface, in some embodiments all the connecting beams which connect heat dissipation plates span-wise are located at the top of the plates away from the chip surface.

Figure 3C:
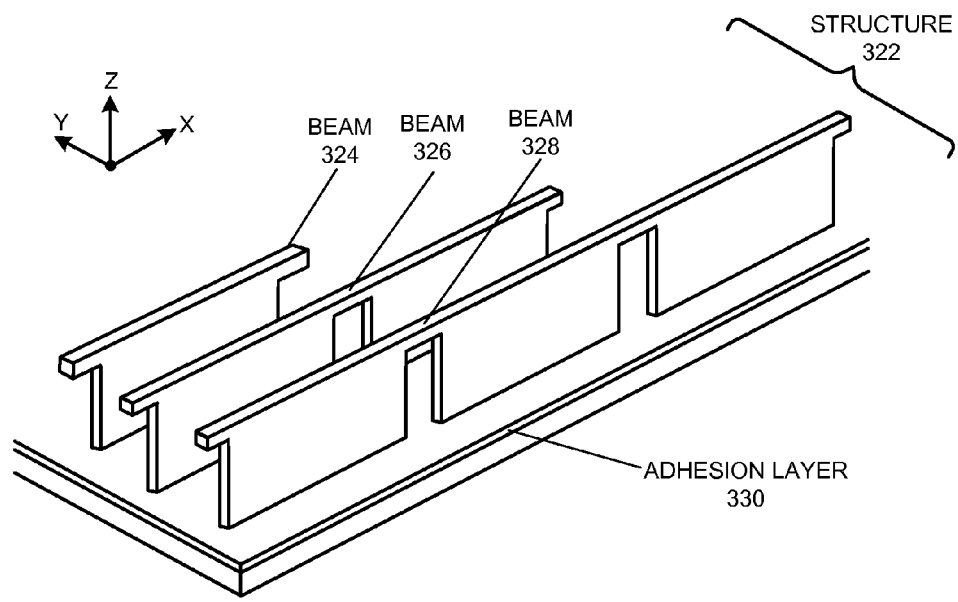
FIG. 3C illustrates a 3D view of yet another heat dissipation structure (partially shown) in accordance with the described embodiments.

FIG. 3C illustrates a 3D view of a heat dissipation structure 322 (partially shown) in accordance with the described embodiments. As illustrated in FIG. 3C, heat dissipation structure 322 comprises an array of heat dissipation plates connected length-wise by a set of connecting beams, for example, beams 324-328. Note that each of beams 324-328 is connected to the upper corners of a column of heat dissipation plates away from the chip surface. Similarly to the connectors in FIG. 3B, beams 324-328 have negligible cross-section areas in the length-direction compared to the surface area of the heat dissipation plates in the same direction. Consequently, these connecting beams do not significantly change the compliance of the mechanically coupled plates in the length-direction. Also note that the plates in the span-direction are not connected and remain mechanically isolated. In this embodiment, a set of interconnected plates in the length-direction can be attached to adhesion layer 330 together, which reduces chip package assembling time.

Figure 3D:
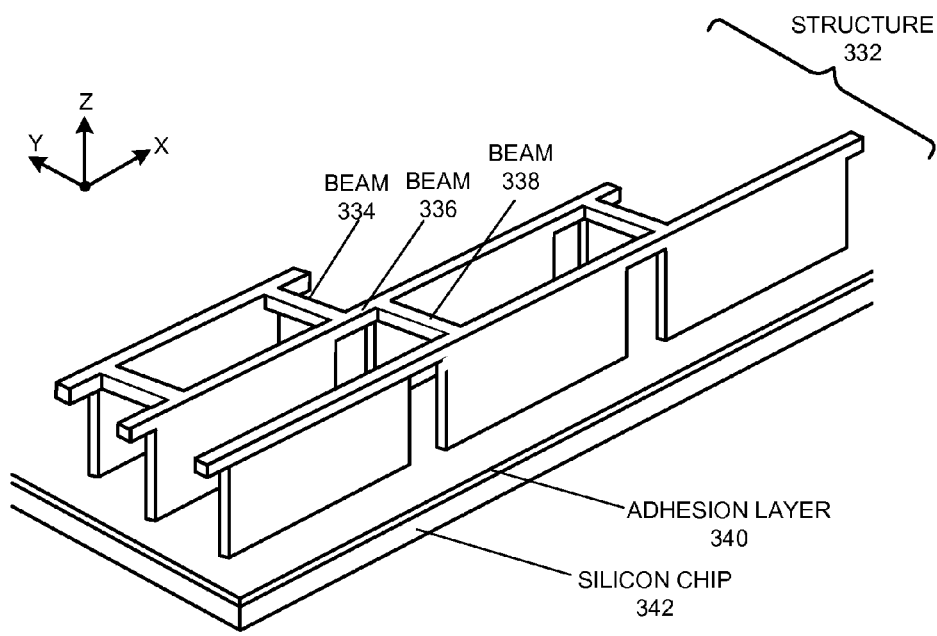
FIG. 3D illustrates a 3D view of a monolithic heat dissipation structure (partially shown) in accordance with the described embodiments.

FIG. 3D illustrates a 3D view of a heat dissipation structure 332 (partially shown) in accordance with the described embodiments. As illustrated in FIG. 3D, heat dissipation structure 332 comprises an array of heat dissipation plates interconnected both length-wise and span-wise by connecting beams, for example, beams 334-338, thereby forming a monolithic heat dissipation structure. In this embodiment, heat dissipation structure 332 can be attached to adhesion layer 340 without the need to individually add each plate to adhesion layer 340. However, the monolithic heat dissipation structure 332 can be more rigid and less compliant than heat dissipation structures 302, 312, and 322 illustrated in FIGS. 3A-3C, respectively, and therefore may require a thicker adhesion layer 340 to match the different thermal expansions between silicon chip 342 and the heat dissipation structure 332.

Figure 4:
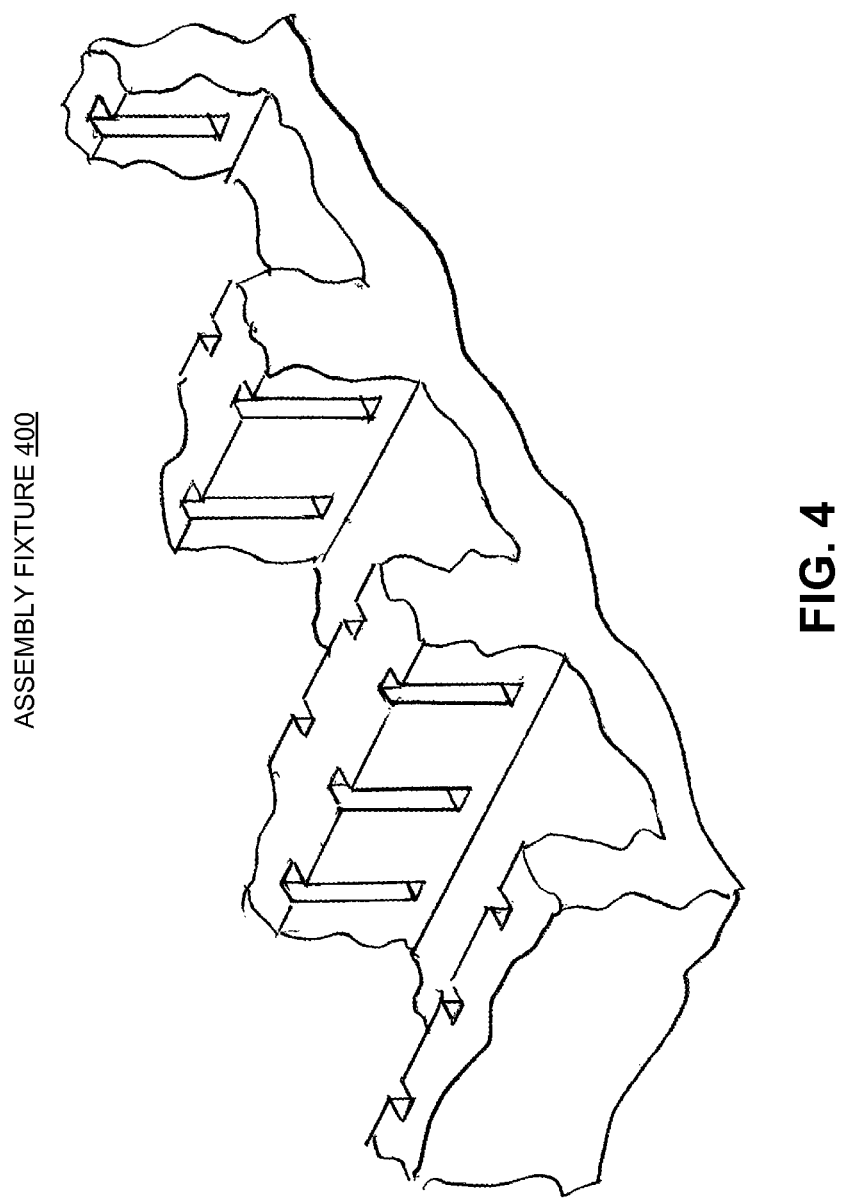
FIG. 4 illustrates a cutaway view of an assembly fixture for supporting a discrete heat dissipation structure in accordance with the described embodiments.

FIG. 4 illustrates a cutaway view of an assembly fixture 400 for supporting a discrete heat dissipation structure in accordance with the described embodiments. Note that for a discrete heat dissipation structure, such as structure 302 in FIG. 3A which comprises possibly hundreds of isolated miniature plates, it can be infeasible to individually attach each plate to the chip die. In one embodiment, assembly fixture 400 may be used to temporarily hold the array of plates by placing these plates within the cutouts in assembly fixture 400, which holds the plates in the right places and orientations. During the chip package assembly process, a chip package comprising a substrate and a chip die can be turned over and put on top of assembly fixture 400 containing the heat dissipation structure. Next, a solder reflow process may be used to create the adhesion layer between the chip die and the heat dissipation structure, and assembly fixture 400 can be subsequently removed. After the chip and heat dissipation structure are assembled, a chip lid, and sometimes a manifold and additional structures for guiding the coolant to and from the heat dissipation structure may be added.

Figure 5:
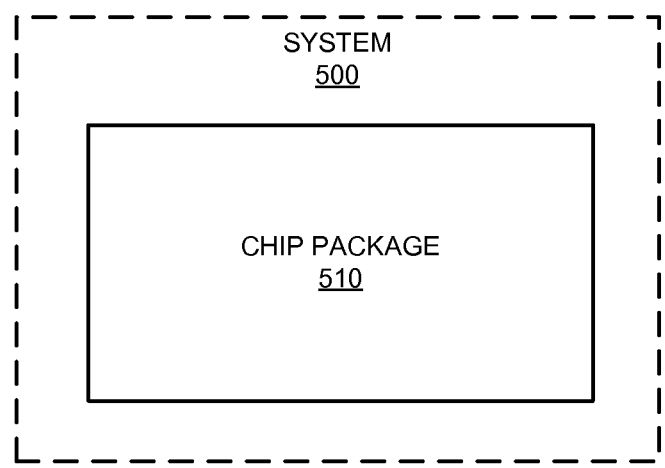
FIG. 5 presents a block diagram illustrating a system that includes a chip package, such as chip package 100 in FIG. 1, in accordance with the described embodiments.

FIG. 5 presents a block diagram illustrating a system 500 that includes a chip package 510, such as chip package 100 in FIG. 1, in accordance with the described embodiments. System 500 may include: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Note that a given computer system may be at one location or may be distributed over multiple, geographically dispersed locations.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. An apparatus for cooling an integrated circuit (IC) die, comprising:
   an adhesion layer with high thermal conductivity coated on a surface of the IC die; and
   a heat dissipation structure comprising one or more sets of heat dissipation plates affixed to the adhesion layer, each plate in the one or more sets having a fin-shaped geometry and oriented such that a largest face of the plate is perpendicular to the surface of the IC die;
   wherein, for a given set of the heat dissipation plates, a first and a second of the plates in the given set are mechanically coupled through two or more top beams located away from the surface of the IC die and oriented perpendicularly to the largest face of the first and second plates;
   wherein the second and a third of the plates for the given set are mechanically coupled through two or more bottom beams located near the surface of the IC die and oriented perpendicularly to the largest face of the second and the third plates; and wherein bottom portions of the first and second plates are not mechanically coupled to each other, and top portions of the second and third plates are not mechanically coupled to each other.

2. The apparatus of claim 1, wherein the plates in the given set of heat dissipation plates are identical to each other.

3. The apparatus of claim 1, wherein the plates in the given set of heat dissipation plates are oriented in the same direction.

4. The apparatus of claim 1, wherein a width of a plate in the given set of heat dissipation plates is less than 1 millimeter.

5. The apparatus of claim 1, wherein a length of a plate in the given set of heat dissipation plates, which is along a direction parallel to the surface of the IC die, is between 1 millimeter and 10 millimeters.

6. The apparatus of claim 1, wherein a height of a plate in the given set of heat dissipation plates, which is along a direction perpendicular to the surface of the IC die, is between 0 and 10 millimeters.

7. The apparatus of claim 1, wherein a pitch in a width-direction between plates in the given set of heat dissipation plates is between 0.1 millimeters and 1 millimeter.

8. The apparatus of claim 1, wherein a channel in a width-direction between two adjacent heat dissipation plates in the given set of heat dissipation plates provides a path for a coolant to flow through while making direct contact with the associated faces of the heat dissipation plates for the given one of the heat dissipation elements.

9. The apparatus of claim 1, wherein the adhesion layer has a thermal conductivity of at least 10 watts/meter/° K.

10. The apparatus of claim 1, wherein the thickness of the adhesion layer is between 10 microns and 50 microns.

11. A chip package, comprising:
a substrate;
an integrated circuit (IC) die coupled to the substrate;
an adhesion layer with high thermal conductivity coated on a surface of the IC die which is opposite to the substrate;
a heat dissipation structure affixed to the adhesion layer comprising one or more sets of heat dissipation plates affixed to the adhesion layer, each plate in the one or more sets having a fin-shaped geometry and oriented such that a largest face of the plate is perpendicular to the surface of the IC die; and
a package lid affixed to the substrate to enclose the IC die and the heat dissipation structure,
wherein, for a given set of the heat dissipation plates, a first and a second of the plates in the given set are mechanically coupled through two or more top beams located away from the surface of the IC die and oriented perpendicularly to the largest face of the first and second plates;
wherein the second and a third of the plates for the given set are mechanically coupled through two or more bottom beams located near the surface of the IC die and oriented perpendicularly to the largest face of the second and the third plates; and wherein bottom portions of the first and second plates are not mechanically coupled to each other, and top portions of the second and third plates are not mechanically coupled to each other.

12. The chip package of claim 11, further comprising:
at least one coolant inlet passing through the package lid which allows a coolant to flow into the chip package; and
at least one coolant outlet passing through the package lid which allows the coolant to flow out of the chip package,
wherein the coolant is guided to flow over the surface of the IC die through a channel between two adjacent heat dissipation plates.

13. The chip package of claim 11, wherein a channel in a width-direction between two adjacent heat dissipation plates in the given set of heat dissipation plates provides a path for a coolant to flow through while making direct contact with the associated faces of the heat dissipation plates for the given one of the heat dissipation elements.

14. The chip package of claim 11, wherein the adhesion layer has a thermal conductivity of at least 10 watts/meter/° K.

15. The chip package of claim 11, wherein the thickness of the adhesion layer is between 10 microns and 50 microns.

16. A method for cooling an integrated circuit (IC) die, comprising:
coating an adhesion layer on a surface of the IC die, wherein the adhesion layer has high thermal conductivity;
affixing a heat dissipation structure onto the adhesion layer, wherein the heat dissipation structure comprises one or more sets of heat dissipation plates affixed to the adhesion layer, each plate in the one or more sets having a fin-shaped geometry and oriented such that a largest face of the plate is perpendicular to the surface of the IC die; and
dissipating heat generated from the IC die through the set of heat dissipation elements which provide an extended heat dissipation surface for the IC die;
wherein, for a given set of the heat dissipation plates, a first and a second of the plates in the given set are mechanically coupled through two or more top beams located away from the surface of the IC die and oriented perpendicularly to the largest face of the first and second plates;
wherein the second and a third of the plates for the given set are mechanically coupled through two or more bottom beams located near the surface of the IC die and oriented perpendicularly to the largest face of the second and the third plates; and
wherein bottom portions of the first and second plates are not mechanically coupled to each other, and top portions of the second and third plates are not mechanically coupled to each other.

17. The method of claim 16, wherein the plates for the given set are arranged in a row along a dimension that is parallel to the surface of the IC die.

18. The method of claim 16, wherein the heat dissipation elements provide an extended heat dissipation surface for the IC die.

19. The method of claim 16, wherein the adhesion layer has a thermal conductivity of at least 10 watts/meter/° K.

20. The method of claim 16, wherein the thickness of the adhesion layer is between 10 microns and 50 microns.

* * * * *